United States Patent
Bataineh (10) Patent No.: US 7,363,573 B1
(45) Date of Patent: Apr. 22, 2008

(54) METHOD AND APPARATUS FOR A DEDICATED CYCLIC REDUNDANCY CHECK BLOCK WITHIN A DEVICE

(75) Inventor: Khaldoun Bataineh, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 437 days.

(21) Appl. No.: 11/032,396

(22) Filed: Jan. 10, 2005

(51) Int. Cl.
H03M 13/00 (2006.01)
(52) U.S. Cl. .................................... 714/758
(58) Field of Classification Search .............. None
See application file for complete search history.

(56) References Cited

U.S. PATENT DOCUMENTS

| | | | |
|---|---|---|---|
| 6,647,528 B1 * | 11/2003 | Collette et al. ............ | 714/758 |
| 6,671,832 B1 * | 12/2003 | Apisdorf .................... | 714/52 |
| 6,938,197 B2 * | 8/2005 | Doubler et al. ............ | 714/757 |
| 7,139,963 B1 * | 11/2006 | Fox ............................ | 714/758 |
| 2003/0097628 A1 * | 5/2003 | Ngo et al. .................. | 714/736 |

OTHER PUBLICATIONS

Xilinx, Inc.; U.S. Appl. No. 11/265,815 by Bataineh, filed Nov. 3, 2005.
Borrelli, Chris; "IEEE 802.3 Cyclic Redundancy Check," XAPP209, Mar. 23, 2001, pp. 1-8, (v1.0), available from Xilinx, Inc., 2100 Logic Drive, San Jose, CA 95124.
Xilinx, Inc., "RocketIO™ Transceiver User Guide," UG024, Dec. 9, 2004, pp. 1-156, (v2.5), available from Xilinx, Inc., 2100 Logic Drive, San Jose, CA 95124.

* cited by examiner

*Primary Examiner*—Guy Lamarre
*Assistant Examiner*—Sam Rizk
(74) *Attorney, Agent, or Firm*—LeRoy D. Maunu (57) ABSTRACT

A dedicated Cyclic Redundancy Check (CRC) block within an Integrated circuit IC), for example, a Programmable Logic Device (PLD), allows direct access to the CRC block from within the programmable logic of the IC. Accessibility to the CRC block is achieved from any communication layer of the fabric due to the separation of the CRC block from the physical layer. All inputs and outputs of the CRC block are provided to the fabric to allow full controllability of CRC operation including data width, initial CRC value, and idle cycle introduction.

23 Claims, 8 Drawing Sheets

METHOD AND APPARATUS FOR A DEDICATED CYCLIC REDUNDANCY CHECK BLOCK WITHIN A DEVICE

FIELD OF THE INVENTION

The present invention generally relates to Integrated Circuits (ICs), and more particularly to an IC such as a Programmable Logic Device (PLD) having a dedicated Cyclic Redundancy Check (CRC) block.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored off-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

In many communication applications, for example, PLD based systems are used to balance the efficiency of Application Specific Integrated Circuits (ASICs) with the flexibility of software. In such systems, the PLD off-loads the Central Processing Unit (CPU) for specific algorithms that are not efficiently handled within the CPU. A CRC algorithm represents such an exemplary computation that is suitable for PLD implementation, since a wide variety of communication protocols utilize the CRC algorithm at various communication layers within the Open System Interconnection (OSI).

In the prior art, CRC specific blocks are among the many predetermined block functionalities that are incorporated into the core. Such an implementation, however, utilizes a substantial portion of the programmable fabric that exists within the PLD. Often, the CRC specific blocks are also positioned at the physical layer within the OSI model. Such a positioning, however, precludes use of the CRC block for those communication protocols that require usage of the CRC block at the higher protocol layers, such as the data link or transport layers.

SUMMARY

To overcome limitations in the prior art, and to overcome other limitations that will become apparent upon reading and understanding the present specification, the present invention discloses an apparatus and method for allocating a dedicated CRC block within an IC, for example, a PLD that is accessible by the PLD programmable fabric. Such positioning allows full controllability of the CRC, while allowing full access to the CRC from the PLD fabric.

In accordance with one embodiment of the invention, a method of performing a Cyclic Redundancy Check (CRC) calculation from within an integrated circuit (IC) comprises propagating a data block within programmable logic of the IC, providing the data block to a CRC block, where the CRC block is external to the programmable logic. The method further comprises calculating a CRC result of the data block, and returning the CRC result to the programmable logic from the CRC block.

In accordance with another embodiment of the invention, a Field Programmable Gate Array (FPGA) comprises a programmable fabric coupled to receive and transmit data blocks. The FPGA further comprises a dedicated Cyclic Redundancy Check (CRC) module external to the programmable fabric that is adapted to perform CRC calculations on the transmitted data blocks from the programmable fabric. The FPGA further comprises a dedicated CRC module external to the programmable fabric that is adapted to perform CRC calculations on the Received data blocks to the programmable fabric.

In accordance with another embodiment of the invention, a method of performing a Cyclic Redundancy Check (CRC) in a Field Programmable Gate Array (FPGA) comprises propagating data blocks through a plurality of communication layers within an FPGA fabric, detecting that any one of the plurality of communication layers requires a CRC calculation, transferring the data blocks from the detected communication layer to a CRC block, the CRC block being adapted to perform CRC calculations on the data blocks while operating externally to the FPGA fabric, and receiving the CRC calculation results from the CRC block by the detected communication layer within the FPGA fabric.

In accordance with another embodiment of the invention, a method of performing an accumulated Cyclic Redundancy Check (CRC) within a Programmable Logic Device (PLD) comprises determining a data width of a received data block, determining a number of CRC calculations required to accommodate the data width, and accumulating interim CRC calculation results external to a programmable fabric of the PLD to determine a final CRC result.

BRIEF DESCRIPTION OF THE DRAWINGS

Various aspects and advantages of the invention will become apparent upon review of the following detailed description and upon reference to the drawings in which.

DETAILED DESCRIPTION

Generally, the present invention is applied to the field of ICs, which allocate a separate block for CRC handling. Since the allocation of the CRC block is implemented using standard cell libraries, the CRC exhibits high speed capability with minimized area requirements. The logical introduction of the CRC block may be handled at any point within programmable logic in an IC, since the CRC block is directly accessible from the fabric.

CRC block accessibility from the fabric facilitates exposure of the CRC block's Input/Output (I/O). In such an instance, full control of the CRC block is achieved, allowing for programmable data width calculations, initial CRC value modification, and idle cycle insertion. In addition, an interface circuit may be utilized to allow for slower speed interfacing to the fabric, while allowing higher data rate and wider data width calculations within the CRC block.

CRC block accessibility from the fabric also allows for other communication functions that are not currently allowed by prior art CRC cores, such as channel bonding. Channel bonding at the physical layer allows two or more communication channels to be combined to form a higher bandwidth channel. Since the CRC block in accordance with an embodiment of the present invention does not require CRC computations to be conducted in any particular communication layer, the required channel bonding may take place at the appropriate layer, while allowing the required CRC calculations to be performed at other layers, depending upon the communication protocol being used.

Application of the present invention is virtually unlimited and may be utilized with any communication protocol that requires CRC error detection. Communication system 100 of FIG. 1, for example, is illustrated in which the present invention may be utilized. Communications equipment blocks 102-106 may represent communicating entities, in which communication takes place at various levels and distances using various wired and/or wireless technologies.

Figure 1:
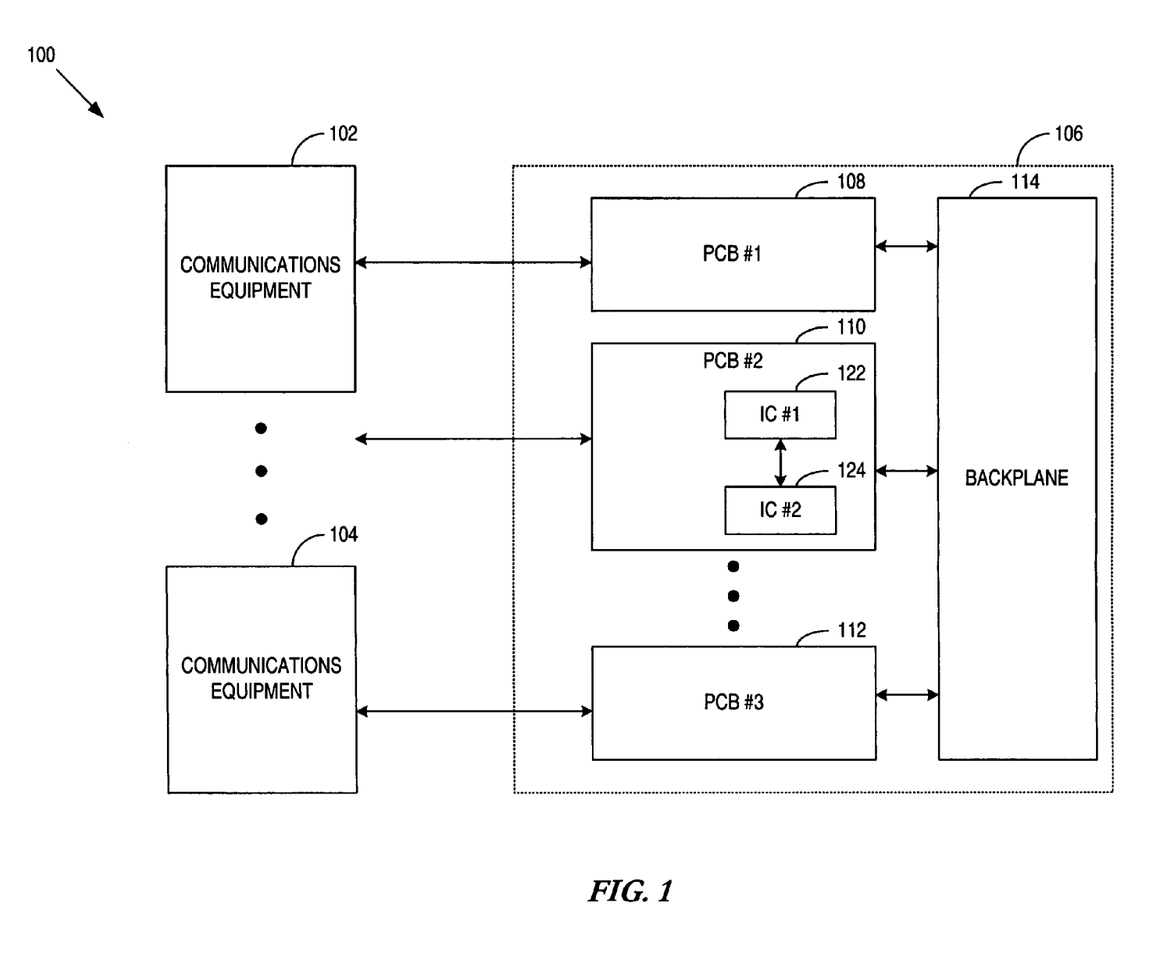
FIG. 1 illustrates an exemplary communication system.

Communications equipment blocks 102-104, for example, may communicate with communications block 106 via a Local Area Network (LAN) or Storage Network (SN) using technologies such as 1 Gigabit Ethernet, or 10 Gigabit Ethernet, as specified by IEEE 802.3. Communication system 100 may designate a data center, SN, or System Area Network (SAN), in which the Infiniband serial I/O interconnect architecture, or Fiber Channel, is utilized. Conversely, communication system 100 may represent a Synchronous Optical NETwork (SONET) or Synchronous Digital Hierarchy (SDH) employed by many Internet Service Providers (ISPs) and other high bandwidth end users.

Still other communication technologies supported by communication system 100 may include Peripheral Component Interconnect (PCI), PCI-Express, RapidIO, and Serial Advanced Technology Attachment (ATA). Such communication standards may be implemented, for example, to support communications between Printed Circuit Boards (PCBs) 108-112, Integrated Circuits 122-124, and backplane 114. As can be recognized by one of ordinary skill in the art, any number of communication standards may benefit from the present invention as is discussed in more detail below.

Figure 2:
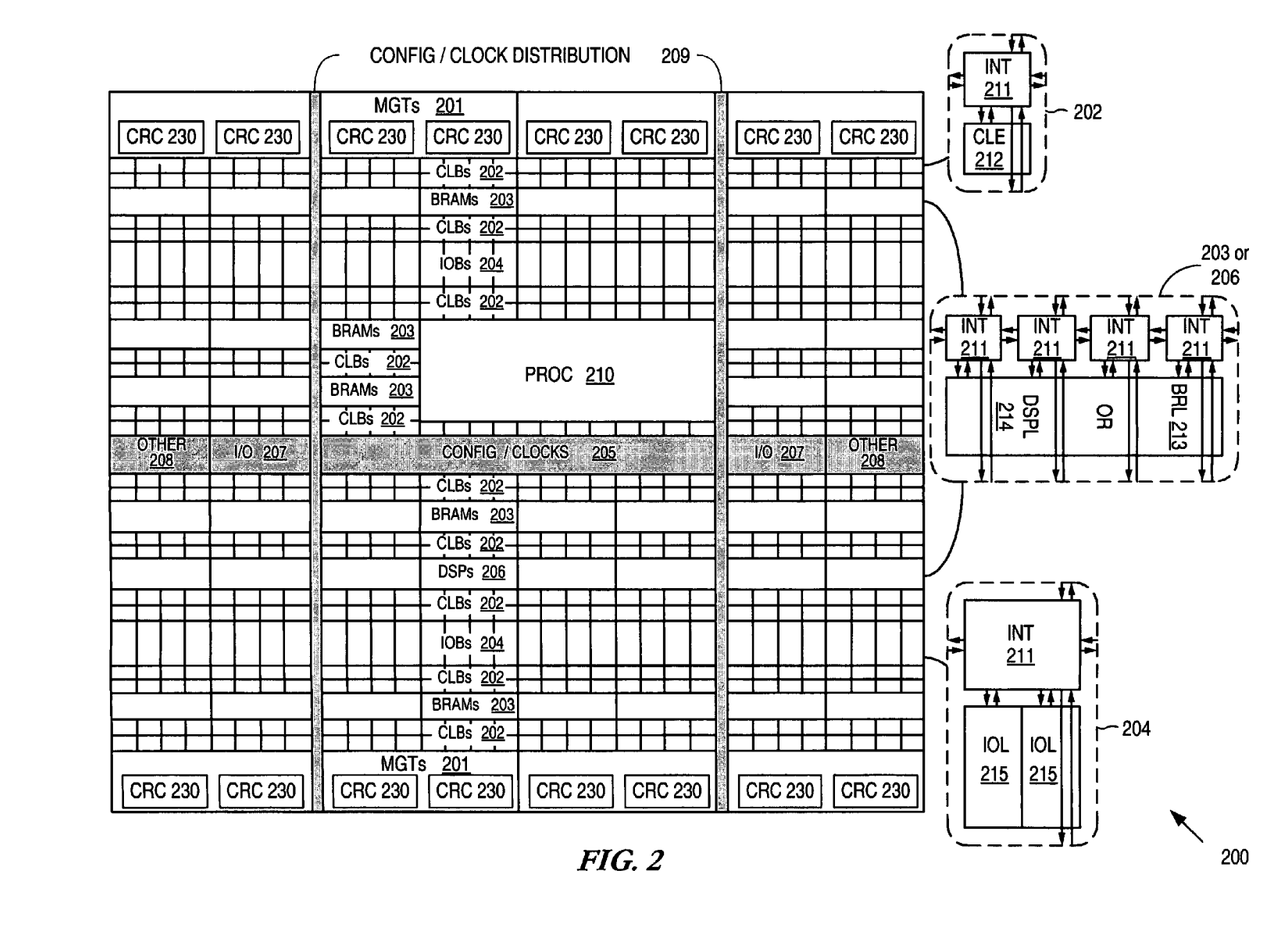
FIG. 2 illustrates an exemplary Field Programmable Gate Array (FPGA) architecture.

As noted above, advanced FPGAs can include several different types of programmable logic blocks in the array. For example, FIG. 2 illustrates an FPGA architecture 200 that includes a large number of different programmable tiles including Multi-Gigabit Transceivers (MGTs) 201, CLBs 202, BRAMs 203, IOBs 204, configuration and clocking logic CONFIG/CLOCKS 205, DSPs 206, specialized I/O 207, including configuration ports and clock ports, and other programmable logic 208, such as digital clock managers, analog-to-digital converters, system monitoring logic, and so forth.

Some FPGAs also include dedicated processor blocks PROC 210, in which specific CPU related functionality may be utilized that is separate from the FPGA fabric. In accordance with an embodiment of the present invention, CRC blocks 230 contained within MGTs 201 are also contemplated, which represent separate blocks for CRC handling. Such separate handling of the CRC functionality is effective to remove the prior art handling of CRC calculations from the FPGA fabric to provide a customized and programmable ASIC that is area efficient, fully controllable, accessible from the FPGA fabric, faster than the FPGA fabric, and able to handle different data rates.

In some FPGAs, each programmable tile includes programmable interconnect element INT 211 having standardized connections to and from a corresponding interconnect element in each adjacent tile. Therefore, the programmable interconnect elements taken together implement the programmable interconnect structure for the illustrated FPGA. INT 211 also includes the connections to and from the programmable logic element within the same tile, as shown by the examples of blocks 202 and 204.

For example, a CLB 202 may include a Configurable Logic Element CLE 212 that may be programmed to implement user logic plus a single programmable interconnect element INT 211. A BRAM 203 can include a BRAM logic element (BRL 213) in addition to one or more programmable interconnect elements. Typically, the number of interconnect elements included in a tile depends on the height of the tile (as measured from right to left of FIG. 2). In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 may include, for example, two instances of an input/output logic element IOL 215 in addition to one instance of the programmable interconnect element INT 211.

As will be clear to those of skill in the art, the actual I/O pads connected, for example, to the I/O logic element 215 are manufactured using metal layers above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 may span several columns of CLBs and BRAMs, whereas CRC 230 may span a single column of BRAMS.

Note that FIG. 2 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 202, 203, and 204 are purely exemplary. For example, in an actual FPGA more than one adjacent column of CLBs is typically included wherever the CLBs appear, to facilitate the efficient implementation of user logic.

Figure 3:
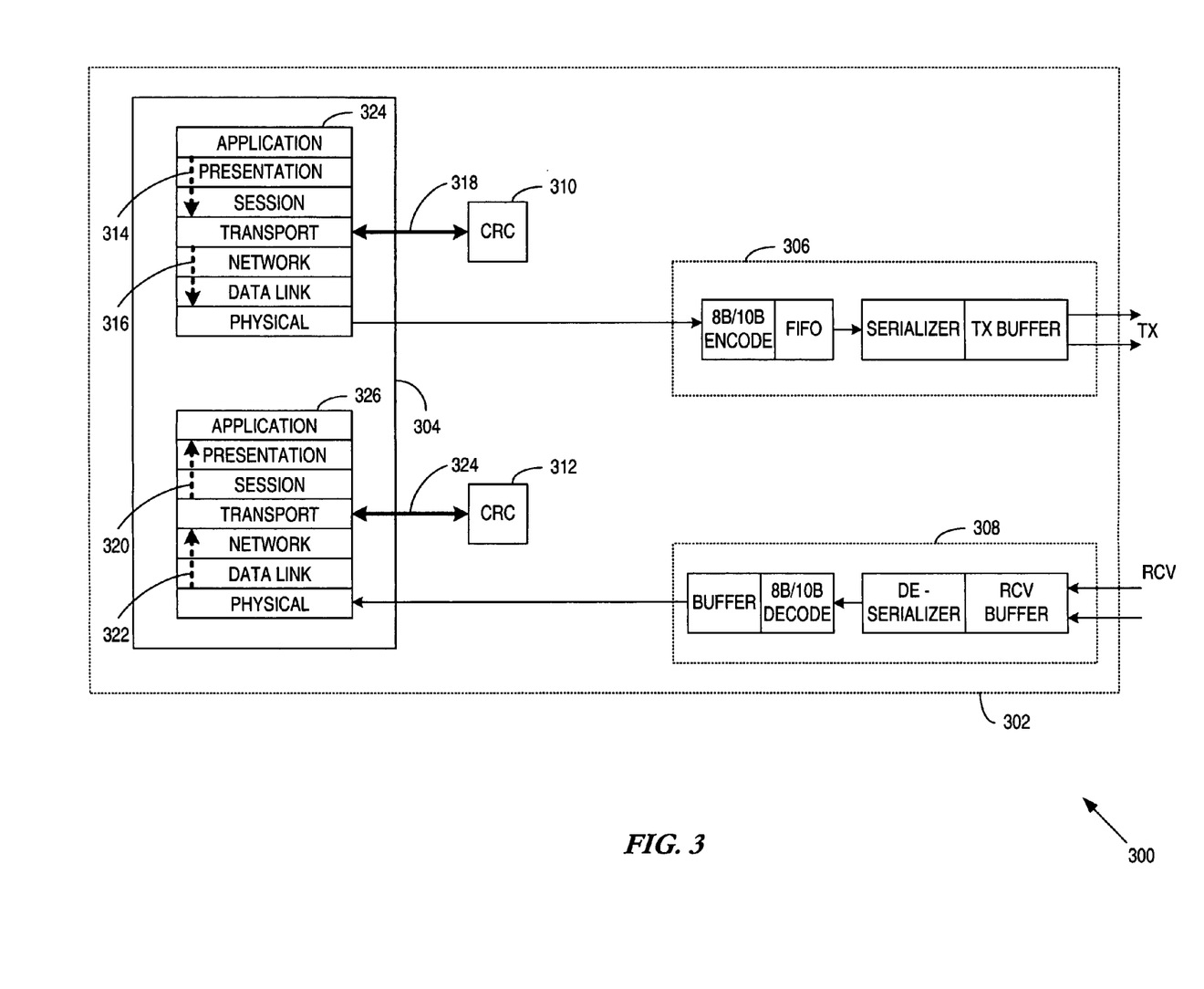
FIG. 3 illustrates an exemplary Field Programmable Gate Array (FPGA) in accordance with an embodiment of the present invention.

Turning to FIG. 3, exemplary FPGA block diagram 300 in accordance with an embodiment of the present invention is illustrated in which FPGA 302 conducts serial communications with external communications equipment (not shown). Internal to FPGA fabric 304, communication stacks 324 and 326 may be associated with any number of communication protocols and operated to support the communication. In accordance with an embodiment of the present invention, CRC blocks 310 and 312 are positioned external to FPGA fabric 304, such that communication links 318 and 324 may establish a connection with communication stacks 324 and 326, respectively, via any one of their respective OSI layers as illustrated in FIG. 3. For exemplary purposes only, communication link 318 establishes a connection between CRC 310 and communication stack 324, via the transport layer of communication stack 324. Similarly, communication link 324 establishes a connection between CRC 312 and communication stack 326, via the transport layer of communication stack 326.

Using such an arrangement, data frames outbound from FPGA fabric 304 may propagate from, for example, the application layer to the transport layer of communication stack 324 via communication path 314. Providing that the particular communication protocol in use requires CRC processing on the transport layer, communication path 318 supplies the data frames to CRC block 310 from the transport layer. It should be noted that since CRC block 310 is removed from FPGA fabric 304, any one of the seven OSI layers of communication stack 324 may forward the data frames to CRC block 310. In such a way, virtually any communication protocol may be supported by the present invention, regardless of the particular layer in which CRC processing is required.

The data frames received by CRC block 310 are treated as a single binary word, $M_1$, and then processed by using a key word, $k_1$. The remainder, $r_1$, left after passing $M_1$ through the CRC process that is controlled by $k_1$, constitutes the residue for the given data frame. The remainder is then passed back to the transport layer via communication link 318 and ultimately passed down to the physical layer via communication link 316. Transmitter 306 then sends both the message string, $M_1$, and the residue, $r_1$, to the external communications equipment (not shown).

The external communications equipment (not shown) completes the communication link by transmitting data frames to be received by receiver 308. Communication path 322 of communication stack 326 then delivers the received data frames, $M_2$, to, for example, its transport layer. The transport layer then delivers the received data frames to CRC 312 via communication path 324. CRC 312 checks the data by performing the same calculation, i.e., processing $M_2$ by the same key word $k_1$, and verifying that the residue, $r_2$ is equal to the residue transmitted by the external communications equipment (not shown).

Once completed, the verified data frames are then provided to the end application via communication path 320. It should be similarly noted that since CRC block 312 is removed from the physical layer implemented by transmitter 306 and receiver 308, any one of the OSI layers of communication stack 326 may send data frames to CRC block 312 in accordance with the particular communication protocol being implemented by FPGA fabric 304. For example, the special data handling required by the IEEE 802.3z 1000 Base-X protocol in relation to the selection of ordered set based on current running disparity is made possible by the present invention.

Figure 4:
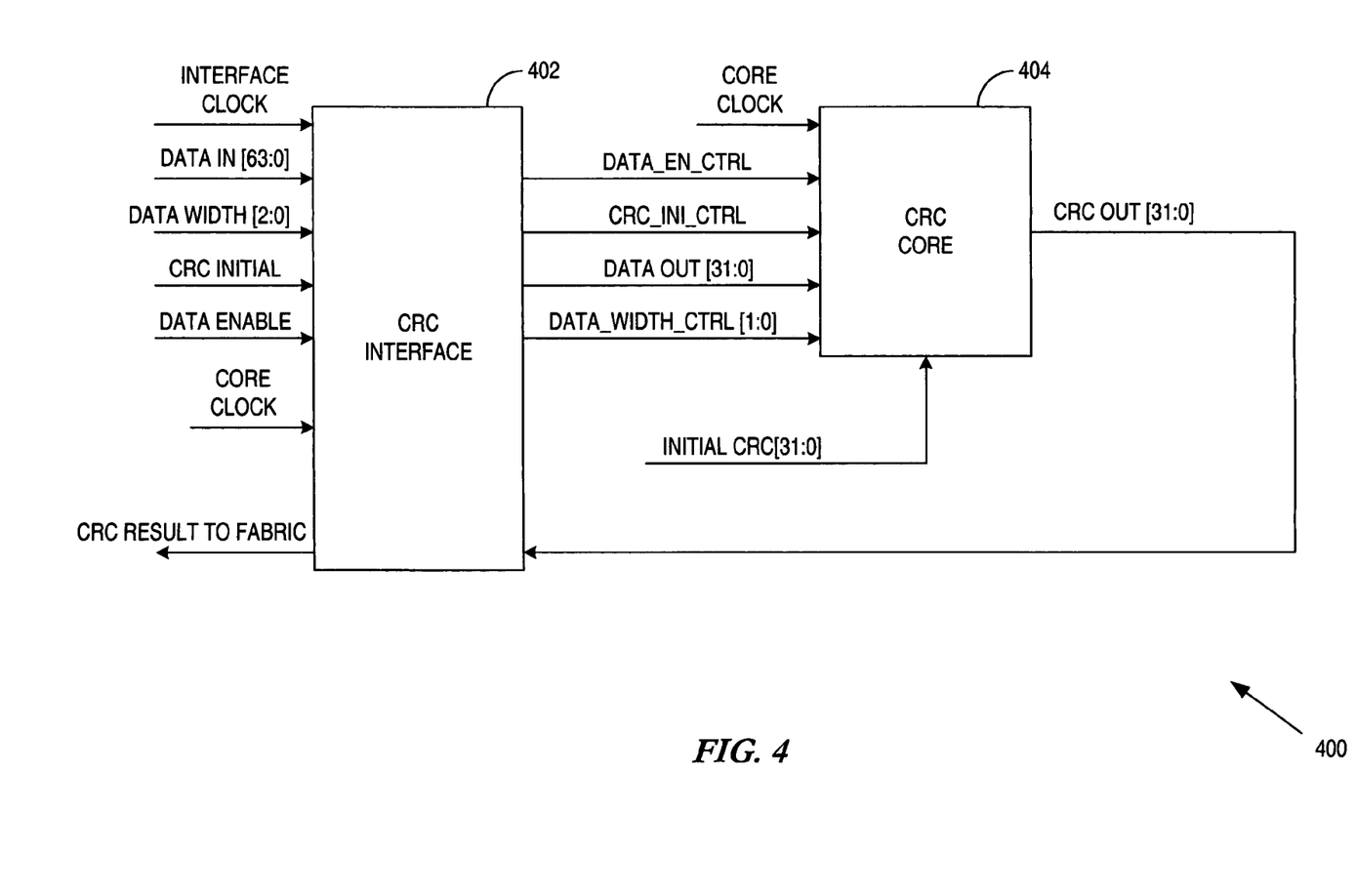
FIG. 4 illustrates an exemplary Cyclic Redundancy Check (CRC) block diagram in accordance with an embodiment of the present invention.

Turning to FIG. 4, exemplary CRC block diagram 400 illustrates one embodiment of CRC blocks 310 and 312 of FIG. 3 in accordance with an embodiment of the present invention. CRC interface 402 is configured to receive up to a 64-bit wide data word, DATA IN[63:0], that is Most Significant Bit (MSB) justified. That is to say that for data widths less than 64 bits, the valid data bit positions within DATA IN[63:0] are aligned from MSB to Least Significant Bit (LSB). A 48 bit data width, for example, occupies bit positions [63:16], whereas bit positions [15:0] are left unoccupied or otherwise in an indeterminate state.

Signal DATA WIDTH[2:0] is operative to indicate the number of active data bytes contained within DATA IN[63:0], where a data byte is defined to be equal to 8 bits. Since there are 8, 8-bit data bytes contained within a 64-bit data word, a 3-bit binary control word, DATA WIDTH[2:0] is effective to uniquely activate/deactivate each 8-bit data byte. Should a 40-bit data width be desired, for example, DATA WIDTH[2:0] takes on a binary value of "101" to indicate that the 5 most significant 8-bit data bytes are to be activated within DATA IN[63:0].

CRC core 404, on the other hand, is configured to receive up to a 32-bit wide data word, DATA OUT[31:0], and a corresponding 2-bit binary control word, DATA WIDTH_CTRL[1:0], that is used to designate which of the 4, 8-bit data bytes are to be activated within DATA OUT[31:0]. Signal INTERFACE CLOCK may run at the same frequency as signal CORE CLOCK for active data widths from 8 bits to 32 bits. For active data widths from 40 bits to 64 bits, on the other hand, signal INTERFACE CLOCK operates at half the frequency of signal CORE CLOCK, since two CRC calculations are required of CRC core 404 for each received data word, DATA IN[63:0].

Alternatively, signal INTERFACE CLOCK may run at half the speed of signal CORE CLOCK for data widths equal to or less than 32 bits, where the data block is not an integer multiple of the data width. In such an instance, for example, if the data block is 136 bits and the data width is 56 bits, then after two full cycles, 24 bits remain to be processed. Thus, since the original data width to be processed is greater than 32 bits, signal INTERFACE CLOCK runs at half the speed of signal CORE CLOCK.

In operation, CRC interface 402 receives up to a 64-bit wide data word, wherein up to 8, 8-bit words may be activated at once. Up to 32 bits of the total number of activated bits are transferred to CRC core 404 in a single clock cycle of CORE CLOCK via DATA OUT[31:0]. Signal DATA WIDTH_CTRL[1:0] determines the particular CRC to be performed, whereby an 8-bit, 16-bit, 24-bit, or a 32-bit CRC calculation is performed by CRC core 404.

Signal CRC INITIAL denotes the start of the data packet to be processed and causes CRC core 404, via CRC_INI_CTRL, to be initialized with INITIAL CRC[31:0] in accordance with the particular CRC standard being implemented. Signal DATA ENABLE, in conjunction with signal DATA_EN_CTRL, is used to start and stop CRC calculations between data packets, or even within a packet, if a stop calculation is required. Both intermediate and final CRC results are passed back to the fabric through CRC interface 402 as discussed in more detail below.

Figure 5A:
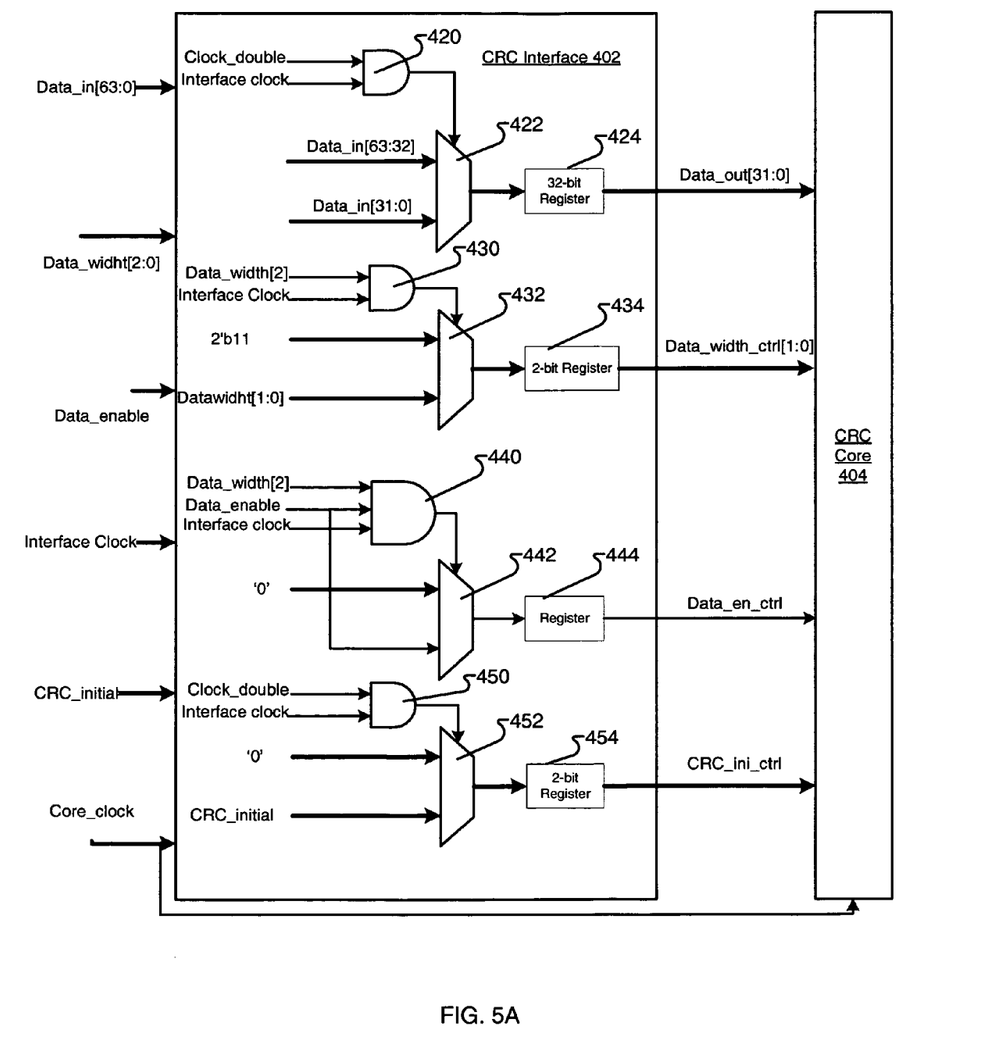
FIG. 5A illustrates an exemplary block diagram of the CRC interface in accordance with an embodiment of the present invention.

FIG. 5A illustrates an exemplary block diagram of the CRC interface 402 in accordance with an embodiment of the present invention. The CRC interface includes multiple multiplexers 422, 432, 442 and 452 controlled by AND gates 420, 430, 440, and 450, respectively. The output of the multiplexers 422, 432, 442 and 452 go to registers 424, 434, 444, and 454, respectively. The CRC interface circuit has two modes, when the input data width is 32 bits or less and when the input data width is more than 32 bits, for example, 64 bits. In the first mode, the clock_double is not asserted when the core clock is about equal to the interface clock. The data_out[31:0] gets the data from only data_in[31:0]. The data_width_ctrl[1:0] gets data_width[1:0]. Data_en_ctrl (the enable CRC calculation signal) gets data_enable. And CRC_ini_ctrl gets CRC_initial. In the second mode, the clock double is asserted when the core clock is about double the frequency of the interface clock. In an alternative embodiment the clock double is asserted when the core clock is a multiple of the interface clock. The data_out[31:0] toggles between data_in[62:32] and data_in[31:0] for every interface clock cycle. Data_width_ctrl[1:0] gets two assignments: 2'b11 which is equivalent to 32-bits, when data_width[2] is asserted and data_width[1:0] otherwise. CRC_ini_ctrl gets 0, when clock double is asserted and interface clock is asserted and CRC_initial otherwise. And data_en_ctrl gets data_enable, if data_width[2] is asserted; and if data_width[2] is not asserted, data_en_ctrl toggles between 0 and data_enable.

Figure 5B:
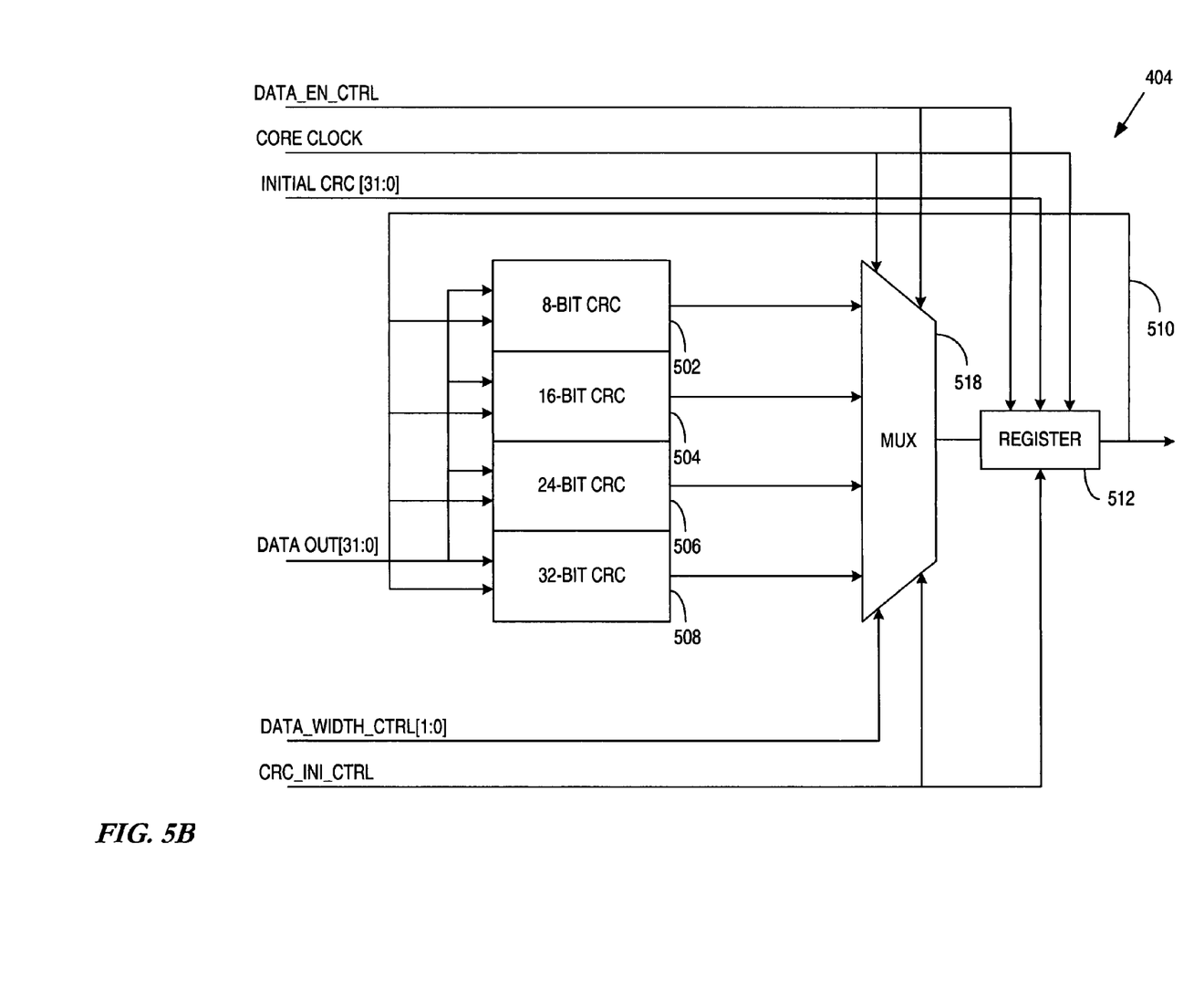
FIG. 5B illustrates an exemplary block diagram of CRC core in accordance with an embodiment of the present invention.

Turning to FIG. 5B, an exemplary block diagram of CRC core 404 in accordance with an embodiment of the present invention is illustrated. As discussed above, DATA OUT[31:0] represents a data word of up to 32 bits that is MSB justified. As can be seen, data width resolution is provided in 8-bit increments through the operation of CRC blocks 502-508. That is to say that depending upon the value of signal DATA WIDTH_CTRL[1:0], either 32, 24, 16, or 8 bits of signal DATA OUT[31:0] are enabled. Each CRC block then performs the corresponding CRC calculation on Data Out[31:0] in accordance with DATA WIDTH_CTRL [1:0]. Signal DATA WIDTH_CTRL[1:0] is then operative to select the corresponding CRC calculation result via multiplexer 518 and register 512 to subsequently apply the CRC result onto signal path CRC OUT[31:0] 510.

In the event that the CRC calculation of a data word greater than 32 bits is required, e.g., 56 bits, a cumulative CRC operation is performed, whereby after one CORE CLOCK period, the first 32-bit CRC value is calculated by CRC core 404 and is provided by signal CRC OUT[31:0] via signal path 510. In such an instance, signal DATA WIDTH_CTRL[1:0] is set to $11_b$ to indicate that a 32-bit CRC is to be calculated, whereby CRC interface 402 applies the first 32-bit portion of signal DATA IN[63:0] onto signal DATA OUT[31:0] for CRC processing by 32-bit CRC block 508. CRC processing is performed either on a previously saved CRC result from previous CRC cycles, or on initialization data provided by signal INITIAL CRC[31:0] in the event that the 32-bit CRC is the first calculation cycle.

After the second CORE CLOCK period, the subsequent 24-bit CRC value is calculated by setting signal DATA WIDTH_CTRL[1:0] to $10_b$ to indicate that a 24-bit CRC is to be calculated. CRC interface 402 then applies the remaining 24-bit portion of signal DATA IN[63:0] onto signal DATA OUT[31:0] for processing by 24-bit CRC block 506, where the intermediate 32-bit CRC result produced by the first CORE CLOCK cycle is also provided to 24-bit CRC block 506 by signal CRC OUT[31:0] via signal path 510. In such an instance, CORE CLOCK is cycling at twice the rate of INTERFACE CLOCK to render the 56-bit CRC result within one INTERFACE CLOCK cycle.

CRC OUT[31:0] may represent an intermediate CRC result, or a final CRC result, depending upon the CRC calculation being performed. It can be appreciated by those of ordinary skill, therefore, that by using the cumulative methodology discussed above, CRC calculations may be performed on virtually any data width by accumulating intermediate CRC results via multiplexer 518 and register 512 and feeding the intermediate results back to CRC blocks 502-508 for accumulation with the next data block.

It is also noted, that the intermediate CRC results supplied to signal path 510 after each CORE CLOCK period are correct up to the point of data calculation. For example, given that a 56-bit CRC is required, a 32-bit CRC calculation is first performed and is then supplied as an intermediate value to 24-bit CRC 506 via signal path 510 after the first cycle of CORE CLOCK. In this instance, not only is the 56-bit CRC calculation valid after the second cycle of CORE CLOCK, but so is the intermediate 32-bit CRC calculation after the first cycle of CORE CLOCK. It can be seen from FIG. 4, that CRC OUT[31:0] provides valid results to the FPGA fabric via CRC interface 402. Thus, CRC updates are available to the FPGA fabric at each INTERFACE CLOCK period.

Figure 6:
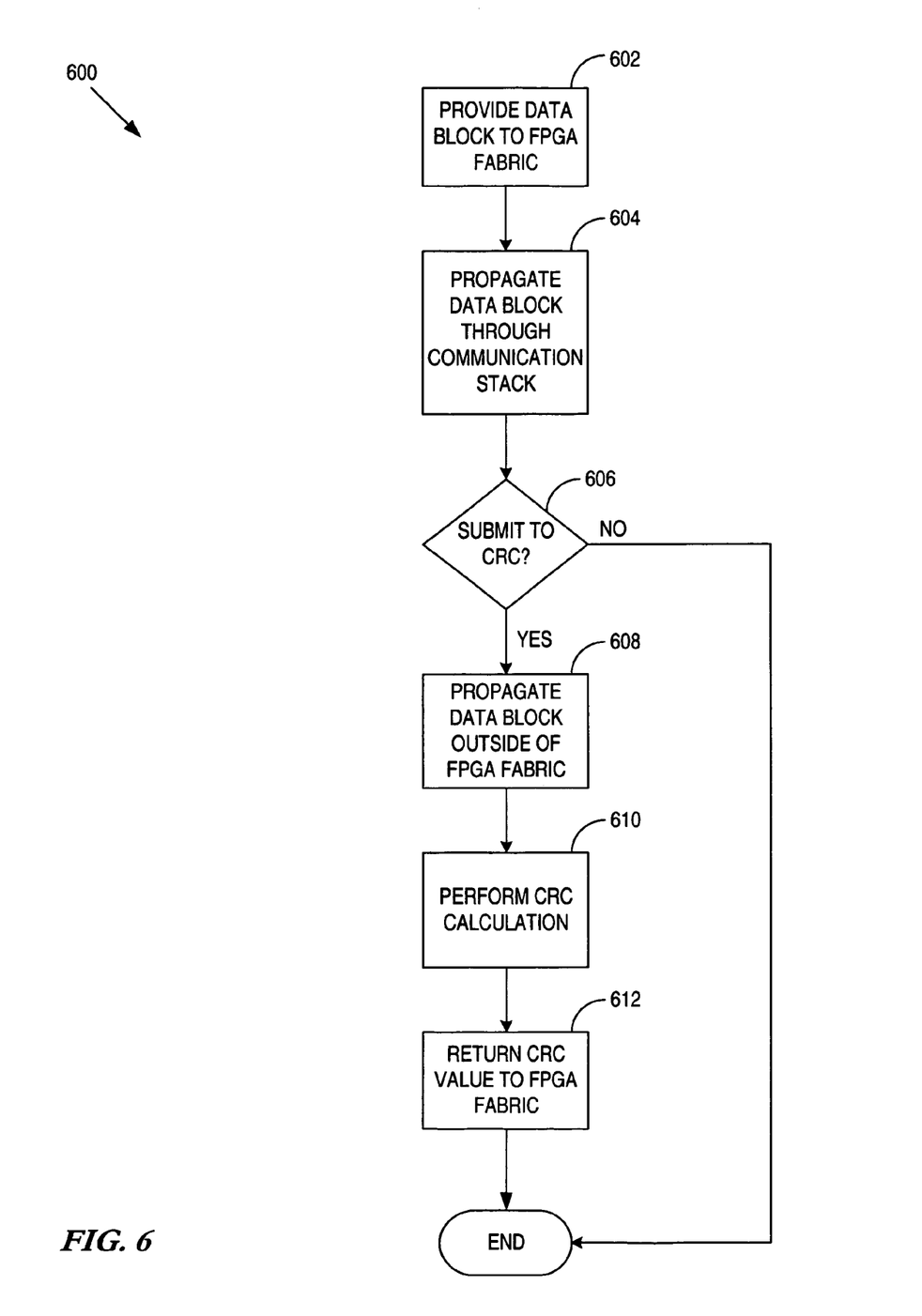
FIG. 6 illustrates an exemplary flow diagram of a method in accordance with an embodiment of the present invention.

Turning to FIG. 6, flow diagram 600 of an exemplary method in accordance with an embodiment of the present invention is illustrated. In step 602, a data block is presented to FPGA fabric, e.g., FPGA fabric 304 of FIG. 3, for processing either by communications stack 324 or 326. The data block is propagated through the appropriate communication path as directed by the corresponding communication protocol being utilized as in step 604.

Once CRC processing is required, as detected in step 606, the data block exits the FPGA fabric as in step 608 and is processed by dedicated CRC blocks 310 or 312 as required, where the CRC processing may take place in accordance with the discussion relating to FIGS. 4 and 5 above as in step 610, which includes initialization of the CRC as required. Once CRC processing completes, the CRC value is returned back to FPGA fabric 304 for further processing as in step 612.

Figure 7:
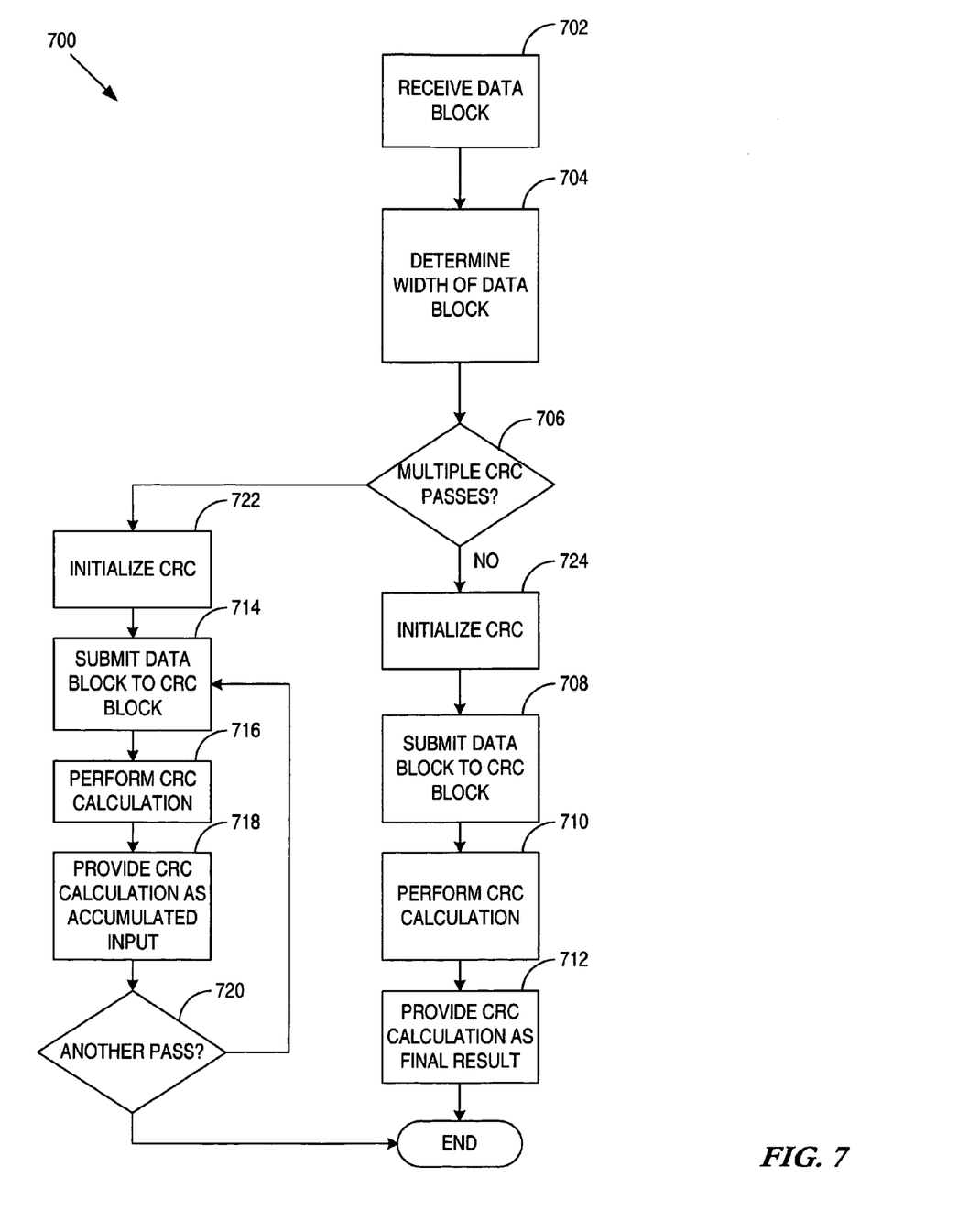
FIG. 7 illustrates an exemplary flow diagram of a method in accordance with an embodiment of the present invention.

Turning to FIG. 7, an exemplary flow diagram of CRC calculation method 700 is now presented in accordance with an embodiment of the present invention as it relates to CRC block diagram 400 of FIG. 4 and CRC core 404 of FIG. 5B. In step 702, a data block is received by CRC interface 402. As illustrated, the data provided at a single interface clock cycle may represent up to 64 bits of data. However, the data size is not necessarily limited to a maximum size of 64 bits, but may rather be extended to virtually any number of bits. In particular, the accumulation methodology as discussed herein in relation to CRC core 404 may be extended over several cycles to accommodate virtually any extended data width.

In step 704, the data width of the data block is determined, whereby the necessity of multiple CRC passes required by the data width is determined in step 704. For example, if a 40-bit CRC calculation is desired, then 2 CORE CLOCK cycles are required so as to facilitate a 32-bit CRC calculation during the first CORE CLOCK cycle, and an 8-bit CRC calculation (accumulated from the 32-bit CRC calculation) during the second CORE CLOCK cycle. Using the architecture of CRC core 404, therefore, it can be seen that virtually any data widths may be accommodated that are an integer multiple of, for example, 8-bit data bytes. Depending upon the standard, any data widths that are not integer multiples of 8-bit data bytes may be padded with logic 0 values.

The accumulation architecture of CRC core 404 also alleviates the need to provide CRC calculation blocks in excess of 32 bits. Accordingly, a significant amount of PLD circuit area is preserved for other PLD functions, since the fixed CRC blocks 502-508 may be reused, or accumulated, as necessary to accommodate the required data width.

If a single CRC pass is required, e.g., an 8-bit, 16-bit, 24-bit, or 32-bit CRC calculation, as determined in step 706, then the CRC is initialized as in step 724. The data block is then submitted in step 708 to the appropriate CRC block 502-508, where the CRC calculation is performed as in step 710. The CRC result is provided as the final CRC calculation after a single CORE CLOCK cycle has transpired as in step 712.

If, on the other hand, multiple CRC passes are required, e.g., a 40-bit or greater CRC calculation, then the data block is submitted to CRC core 404 via CRC interface 402 in up to 32-bit segments as in step 714 after the CRC is initialized as in step 722. The number of CRC passes required is determined by first dividing the data block size by the largest CRC block available, e.g., a 32-bit CRC block. Next, any non-zero remainder after the division constitutes an additional CRC pass.

For example, if an 80-bit CRC calculation is required, then dividing 80 by 32 results in 2, 32-bit CRC calculation passes with a 16-bit remainder. Since the remainder is non-zero, the number of passes required increments to 3. Thus, the first two interim CRC calculation passes yields valid 32-bit and 64-bit CRC calculations, respectively, while the 16-bit CRC calculation pass yields the final 80-bit CRC calculation as required.

Each of the 32-bit (or less) segments are submitted to the appropriate CRC block 502-508 for CRC calculation as in step 716, whereby the intermediate CRC result is provided by multiplexer 518 and register 512 after the associated CORE CLOCK cycle completes. It should be noted, that each intermediate result is a valid CRC calculation that may be used for some other purpose and is also used as an accumulation input to the next CRC block 502-508 as in step 718. The next CRC calculation pass is then initiated, the need for which being determined in step 720.

The present invention is believed to be applicable in a variety of applications. In particular, although the present invention is disclosed as being operative with CRC algorithms, one of ordinary skill in the art will recognize relevant application, for example, to the field of data scramblers. In particular, the generator polynomials of CRC blocks 502-508 may be modified to provide scrambling functionality in order to modify the incoming data blocks in accordance with the scrambling polynomials.

Other aspects and embodiments of the present invention will be apparent to those skilled in the art from consideration of the specification and practice of the invention disclosed herein. For example, while a PLD such as an FPGA is used for illustrative purposes, any IC having programmable logic circuits, is considered within the scope of the invention. Thus it is intended that the specification and illustrated embodiments be considered as examples only, with a true scope and spirit of the invention being indicated by the following claims.

What is claimed is:

1. A method of performing a Cyclic Redundancy Check (CRC) calculation from within an integrated circuit (IC), the method comprising:
propagating a data block within programmable logic of the IC;
wherein the propagating is between layers implemented in the programmable logic;
providing the data block to a CRC block, the CRC block being external to the programmable logic;
calculating a CRC result of the data block; and
returning the CRC result to the programmable logic from the CRC block.

2. The method according to claim 1, wherein propagating the data block within the programmable logic comprises exchanging the data block between layers of a communication stack implemented within the IC.

3. The method according to claim 2, wherein providing the data block to the CRC block comprises determining which of the communication stack layers requires CRC processing.

4. The method according to claim 3, wherein providing the data block to the CRC block further comprises providing the data block from the communication stack layer that requires CRC processing.

5. The method according to claim 4, wherein returning the CRC result to the programmable logic comprises returning the CRC result to the communication stack layer that requires CRC processing.

6. The method of claim 1, further comprising:
determining a data width of a received data block;
determining a number of CRC calculations required to accommodate the data width; and
accumulating intermediate CRC calculation results external to programmable logic fabric of the PLD to determine a final CRC result,
wherein the determining the data width, the determining the number of CRC calculations, and the accumulating are Performed by the CRC block.

7. The method according to claim 6, wherein determining a number of CRC calculations required comprises dividing the data width by a fixed CRC block size.

8. The method according to claim 7, wherein the number of CRC calculations required is incremented by one if a non-zero remainder results from the division.

9. The method according to claim 6, wherein accumulating intermediate CRC calculation results comprises providing the intermediate CRC calculation results as inputs to subsequent CRC calculation block.

10. A Field Programmable Gate Array (FPGA), comprising:
a programmable fabric coupled to receive and transmit data blocks;
wherein the data blocks are propagated between layers implemented in the programmable logic; and
a first Cyclic Redundancy Check (CRC) module external to the programmable fabric and adapted to perform CRC calculations on the transmitted data blocks received from the programmable fabric.

11. The FPGA according to claim 10, wherein the first CRC module is further adapted to return the CRC calculations to the programmable fabric.

12. The FPGA according to claim 11, wherein the first CRC module comprises:
a CRC interface coupled to receive the data blocks and a data width indicator; and
a CRC core coupled to the CRC interface and adapted to perform the CRC calculations on portions of the data blocks indicated by the data width indicator.

13. The FPGA according to claim 12, wherein the CRC core comprises:
a plurality of CRC blocks adapted to perform a fixed data width CRC calculation; and
a multiplexer coupled to the plurality of CRC blocks and adapted to select an output of one of the plurality of CRC blocks in accordance with the data width indicator.

14. The FPGA according to claim 13, wherein the multiplexer is adapted to provide the output of one of the plurality of CRC blocks as a final CRC calculation.

15. The FPGA according to claim 13, wherein the multiplexer is adapted to provide the output of one of the plurality of CRC blocks as an intermediate CRC calculation that is input to one of the plurality of CRC blocks.

16. The FPGA according to claim 15, wherein the multiplexer continues to provide intermediate CRC calculations until the data block has been processed.

17. The FPGA according to claim 10 further comprising a second CRC module external to the FPGA and adapted to perform CRC calculations on data blocks externally received by the FPGA.

18. The FPGA according to claim 17, wherein the second CRC module comprises:
a CRC interface coupled to receive the data blocks and a data width indicator; and
a CRC core coupled to the CRC interface and adapted to perform the CRC calculations on portions of the data blocks indicated by the data width indicator.

19. The FPGA according to claim 18, wherein the CRC core comprises:
a plurality of CRC blocks adapted to perform a fixed data width CRC calculation; and
a multiplexer coupled to the plurality of CRC blocks and adapted to select an output of one of the plurality of CRC blocks in accordance with the data width indicator.

20. The FPGA according to claim 19, wherein the multiplexer is adapted to provide the output of one of the plurality of CRC blocks as a final CRC calculation.

21. The FPGA according to claim 19, wherein the multiplexer is adapted to provide the output of one of the plurality of CRC blocks as an intermediate CRC calculation that is input to one of the plurality of CRC blocks.

22. The FPGA according to claim 21, wherein the multiplexer continues to provide intermediate CRC calculations until the data block has been processed.

23. A system for performing a Cyclic Redundancy Check (CRC) comprises:
means for propagating data blocks through a plurality of communication layers within programmable logic;
wherein the means for propagating propagates the data blocks between layers implemented in the programmable logic;
means for detecting that any one of the plurality of communication layers requires a CRC calculation;
means for transferring the data blocks from the detected communication layer to a CRC block, the CRC block adapted to perform CRC calculations on the data blocks while operating externally to the programmable logic; and
means for receiving CRC calculation results from the CRC block by the detected communication layer within the programmable logic.

* * * * *